United States Patent
Chen et al.

(10) Patent No.: US 9,685,332 B2
(45) Date of Patent: Jun. 20, 2017

(54) ITERATIVE SELF-ALIGNED PATTERNING

(71) Applicant: Taiwan Semiconductor Manufacturing Company, Ltd., Hsin-Chu (TW)

(72) Inventors: De-Fang Chen, Hsinchu (TW); Huan-Just Lin, Hsinchu (TW); Chun-Hung Lee, Hsinchu (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

(21) Appl. No.: 14/517,252

(22) Filed: Oct. 17, 2014

(65) Prior Publication Data

US 2016/0111297 A1    Apr. 21, 2016

(51) Int. Cl.
*H01L 29/94* (2006.01)
*H01L 21/033* (2006.01)

(52) U.S. Cl.
CPC ................................ *H01L 21/0337* (2013.01)

(58) Field of Classification Search
None
See application file for complete search history.

(56) References Cited

U.S. PATENT DOCUMENTS

| | | | |
|---|---|---|---|
| 7,972,959 B2 | 7/2011 | Mebarki et al. | |
| 8,836,049 B2* | 9/2014 | Tsai | H01L 21/28088 257/412 |
| 2008/0008969 A1 | 1/2008 | Zhou et al. | |
| 2008/0160763 A1 | 7/2008 | Ban et al. | |
| 2012/0052647 A1* | 3/2012 | Kim | H01L 21/28114 438/300 |
| 2012/0256276 A1* | 10/2012 | Hwang | H01L 21/823842 257/410 |
| 2013/0244437 A1* | 9/2013 | Flachowsky | H01L 21/3086 438/703 |

FOREIGN PATENT DOCUMENTS

| | | |
|---|---|---|
| KR | 20010017089 | 3/2001 |
| KR | 10-2008-0061860 | 12/2006 |
| KR | 10-2009-0018725 | 1/2008 |

OTHER PUBLICATIONS

KR, Office Action, dated Mar. 14, 2016, entitled "Iterative Self-Aligned Patterning", with Translation, 18 pages.

* cited by examiner

*Primary Examiner* — Ali Naraghi
(74) *Attorney, Agent, or Firm* — Haynes and Boone, LLP

(57) ABSTRACT

A method for self-aligned patterning includes providing a substrate, forming a patterned mandrel layer that includes a plurality of mandrel features, the patterned mandrel layer being formed on the substrate, depositing a first spacer layer over the mandrel layer, the first spacer layer comprising a first type of material, anisotropically etching the first spacer layer to leave a first set of spacers on sidewalls of the mandrel features, removing the mandrel layer, depositing a second spacer layer over remaining portions of the first set of spacers, and anisotropically etching the second spacer layer to form a second set of spacers on sidewalls of the first set of spacers.

19 Claims, 8 Drawing Sheets

ITERATIVE SELF-ALIGNED PATTERNING

BACKGROUND

When fabricating integrated circuits, various features such as metal lines are formed into a semiconductor substrate. To form these features, photo-masks are used to form a pattern into a photo-resist layer. The regions where the photo-resist layer is removed expose the underlying substrate to an etching process used to form trenches where metal is subsequently placed.

As the patterns formed into photo-resist layers become increasingly dense, it becomes difficult to use a single photo-mask to form a pattern in the photo-resist layer because features within the nanometer range are smaller than the resolution of a light source to which the photo-resist layer is exposed. In some cases, self-aligned multiple patterning techniques are used to create denser features.

Self-aligned multiple patterning techniques generally involve the use of depositing a spacer material over a mandrel layer. Then, the mandrel layer is removed and the remaining spacer material is used as a hard mask. The underlying layer may be a transient layer used to form another mandrel layer that is patterned through use of the hard mask from the spacer material. This process can be repeated to create denser patterns, and each step utilizes an additional transient layer. It is desirable to use multiple patterning techniques that can be done cost effectively and efficiently.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
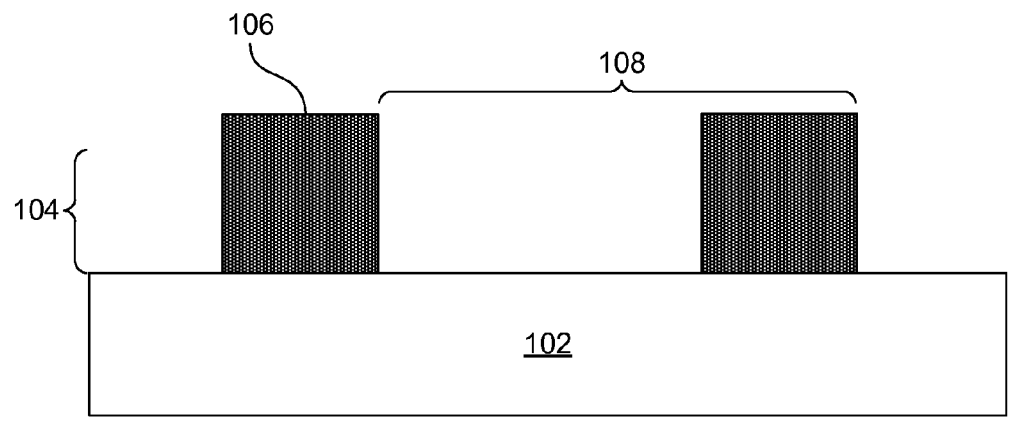
FIGS. 1A-1M are diagrams showing an illustrative process for iterative self-aligned patterning, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to improve the efficiency of self-aligned patterning techniques. According to one embodiment of principles described herein, a spacer layer made of a first type of material is formed over a patterned mandrel layer. The mandrel features are then exposed and removed. The remaining spacer layer features are then used as mandrels for a second spacer layer that is formed over the first spacer layer features. The second spacer layer is made of a second type of material that has an etch selectivity to the first type of material. This patterning technique can repeatedly alternate between spacer layers made of the first type of material and spacer layers made of the second type of material until the pattern reaches the desired density. Then, the pattern can be transferred to the underlying substrate.

FIGS. 1A-1M are diagrams showing an illustrative process for iterative self-aligned patterning. According to the present example, FIG. 1A illustrates a mandrel layer 104 formed on a substrate 102. In one example, the substrate 102 is a semiconductor substrate, such as a semiconductor wafer. The substrate 102 may be made of a semiconductor material such as silicon. In some examples, other materials such as Germanium or III-V semiconductor materials may be used for the substrate 102. The substrate may include additional layers on which a pattern is to be formed.

The mandrel layer 104 may be patterned using various lithographic techniques. The patterned mandrel layer 104 includes features 106 having a first pitch 108. The mandrel layer 104 may be made of standard materials that are typically used for mandrel layers.

Figure 1B:
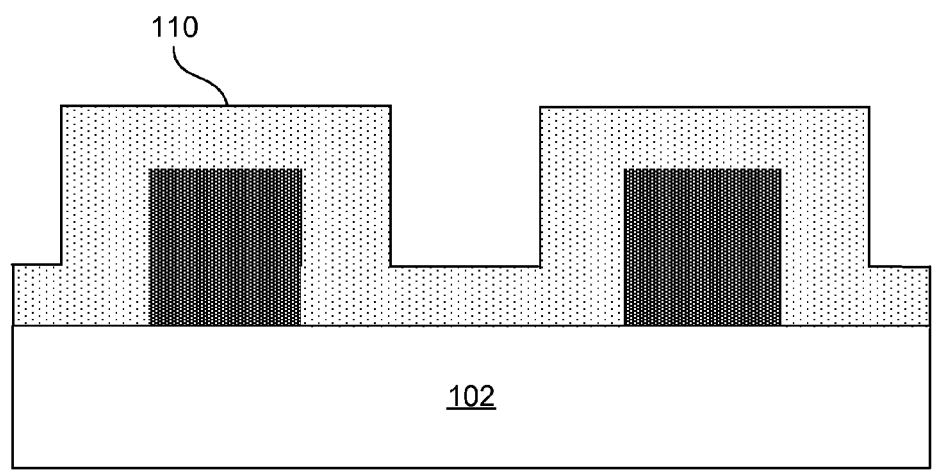

FIG. 1B illustrates the formation of a first spacer layer 110 over the mandrel features. The first spacer layer 110 is deposited such that it conforms to the underlying mandrel features 106. Thus, the first spacer is formed on the sidewalls of the mandrel features 106 as well as the top of the mandrel features 106. The first spacer layer 110 is made from a first type of spacer layer material. More detail on the spacer layer materials used will be provided below.

In one example, the first spacer layer 110 is formed using a Chemical Vapor Deposition (CVD) process. A CVD process involves exposing a substrate to volatile precursors that react and/or decompose to form the deposited layer on the substrate. In one example, the CVD process used to deposit the first spacer layer 110 is a Low-Pressure CVD (LPCVD) process. Such a CVD process utilizes low pressures within the reaction chamber such as sub-atmospheric pressures. In one example, the CVD process used to form the first spacer layer 110 is a Plasma-Enhanced CVD (PECVD) process. A PECVD process utilizes plasma to increase the reaction rate of the precursors. This can allow for the CVD process to be performed at a lower temperature.

Figure 1C:
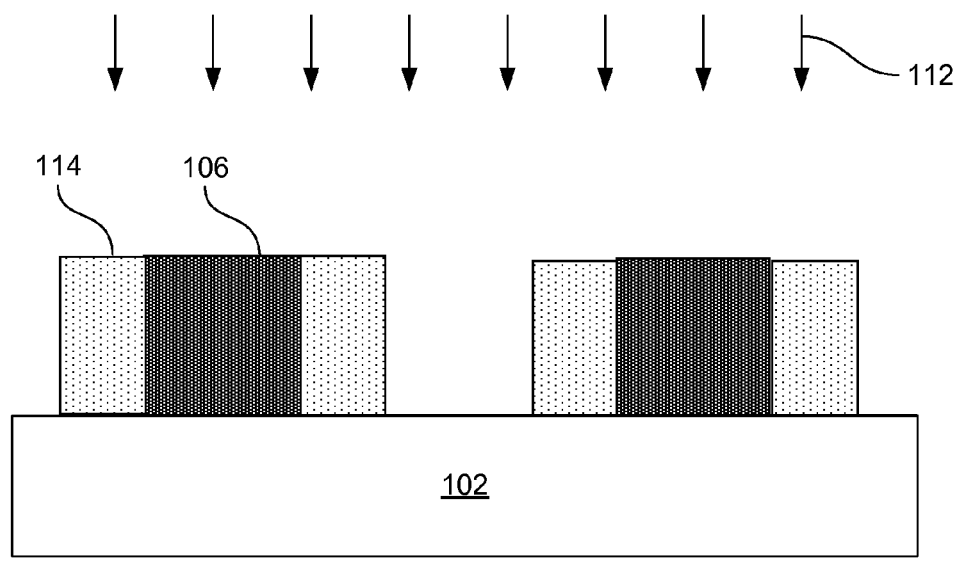

FIG. 1C illustrates a removal process 112 to remove a portion of the first spacer layer 110 to expose the top of the mandrel features 106, thereby leaving a first set of spacers 114 on sidewalls of the mandrel features 106. In one example, the removal process 112 is an anisotropic etching process, such as a dry etching process. The anisotropic etching process means the etching occurs dominantly in one direction. During the anisotropic etching process, the portions of the first spacer layer 110 on the mandrel features 106 and on the substrate 102 are substantially removed while portions on the sidewalls of the mandrel features 106 remain substantially intact. Dry etching is a process of removing material by exposing the material to a bombardment of ions. The dry etch process utilizes a plasma of reactive gases such as fluorocarbons, oxygen, chlorine, boron trichloride and other gases. The bombardment of ions dislodges portions of the exposed surface. The removal process 112 also removes the first spacer layer 110 such that the substrate 102 is exposed.

Figure 1D:
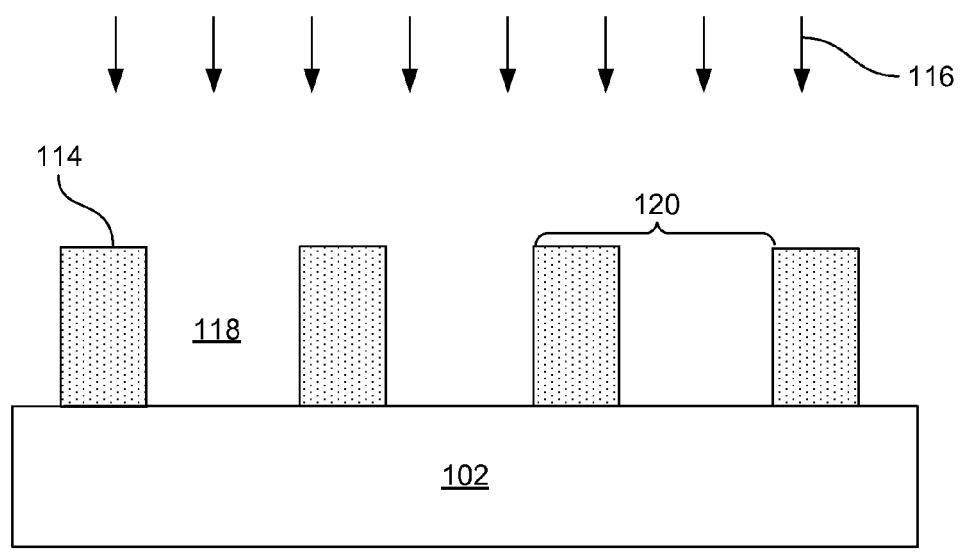

FIG. 1D illustrates a removal process 116 to remove the mandrel features 106. After the removal process 116, there is a void 118 where the mandrel features 106 used to be. The removal process 116 may be an etching process such as a dry etching process. In some examples, the removal process 116 is a wet etching process. Wet etching processes typically involve immersing a material in a chemical etchant such that the exposed portions of material are chemically removed. Wet etching processes are generally isotropic, which means they etch in all directions. The removal process is designed to be selective between the first spacer layer 110 and the material of the mandrel features 106. This means that the removal process 116 removes the mandrel features 106 while leaving the first spacer layer 110 substantially intact.

After removal of the mandrel features 106, the remaining portions of the first spacer layer 110 form features 114 from the remaining sidewall spacers 114. These first spacer layer features 114 have a pitch 120 that is affected by the width of the mandrel features 106 and the pitch 108 of the mandrel features 106. As will be described in further detail below, the first spacer layer features 114 can be used as a mandrel layer for an additional patterning step.

Figure 1E:
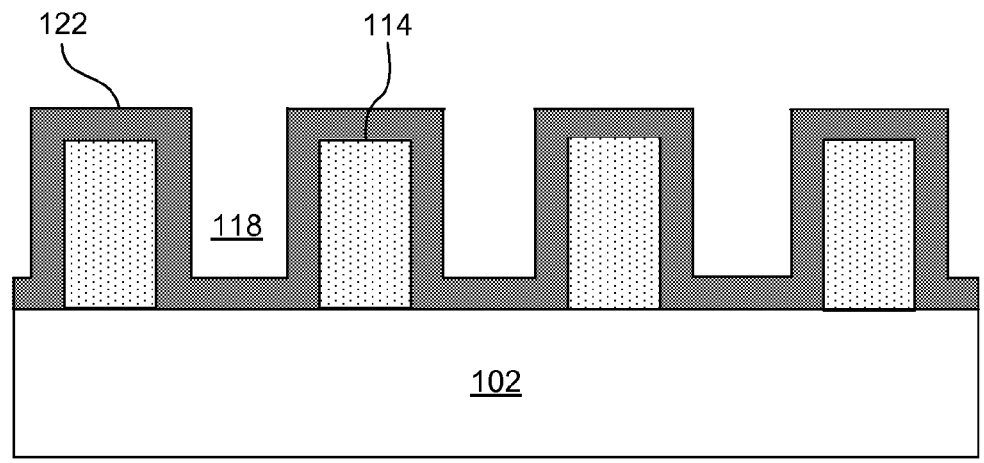

FIG. 1E illustrates the formation of a second spacer layer 122 over the first spacer layer features 114 created by the remaining portions of the first spacer layer 110. The second spacer layer 122 is deposited such that it conforms to the first spacer layer features 114. Thus, the second spacer layer 122 has a similar profile to the profile of the first spacer layer features 114. The second spacer layer 122 may be formed using a CVD process such as a LPCVD or a PECVD process. Thus, the second spacer layer 122 is formed on both the sidewalls and the tops of the first spacer layer features 114. The second spacer layer 122 may be substantially uniform in thickness.

The second spacer layer 122 may be formed of a material that has an etching selectivity to the material type of the first spacer layer 110. According to principles described herein, the first spacer layer is made of a material selected from a first group of materials, and the second spacer layer is made of a material selected from a second group of materials. The materials within the second group of materials have etching selectivity to materials within the first group of materials. For purposes of discussion, materials within the first group of materials will be referred to as material type A and the materials within the second group of materials will be referred to as material type B. In one example, material type A includes dielectric materials such as an oxide, silicon nitride (SiN), silicon oxynitride (SiON), silicon carbide (SiC), silicon carbon nitride (SiCN), or silicon oxynitride carbon (SiONC). Such materials can be deposited using PECVD or LPCVD as described above. Additionally, such dielectric materials may be formed using Atomic Layer Deposition (ALD). Material type B includes conductive materials such as amorphous silicon or amorphous carbon. Such materials may be formed using PECVD or LPCVD.

In such a case, materials of material type A and materials of material type B are chosen to have high etching selectivity during anisotropic etchings to form respective spacers. In one example, an anisotropic etching process that utilizes a fluorine based gas can be used to remove the material type A. Such a process will remove material type A while leaving material type B substantially intact. Additionally, an anisotropic etching process that utilizes a chlorine based gas can be used to remove material type B. Such a process will remove material type B while leaving material type A substantially intact.

In one example, the first spacer layer 110 is made of material type A and the second spacer layer 122 is made of material type B. In some examples, however, the first spacer layer 110 is made of material type B and the second spacer layer 122 is made of material type A. Both materials type A and material type B have good conforming properties such that the materials can be effectively deposited to conform to underlying features.

Figure 1F:
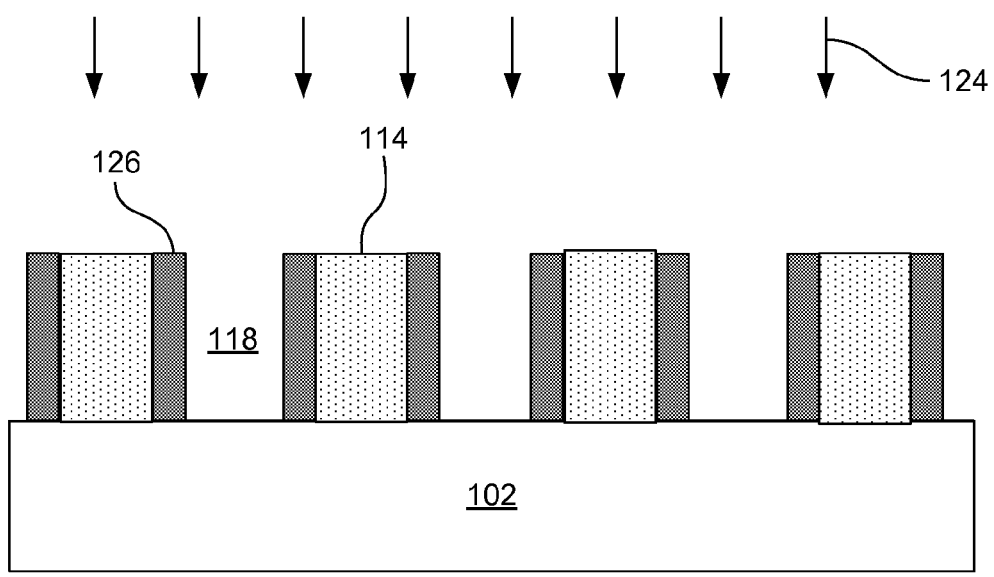

FIG. 1F illustrates a removal process 124 to remove a portion of the second spacer layer 122 to expose the top surfaces of the first spacer layer features 114. The removal process 124 may be an anisotropic etching process such as a dry etching process. This process leaves a second set of sidewall spacers 126 on the sidewalls of the first spacer layer features 114. The space between the spacer layers is based on the thickness of the second spacer layer 122. In one example, if the second spacer layer 122 is made of a dielectric material, then a fluorine based etching process is used for the removal process 124. If, however, the second spacer layer 122 is made from a conductive material, then a chlorine based dry etching process is used as the removal process 124. The removal process 124 may also expose the underlying substrate 102 at regions not protected by the first spacer layer features 114.

Figure 1G:
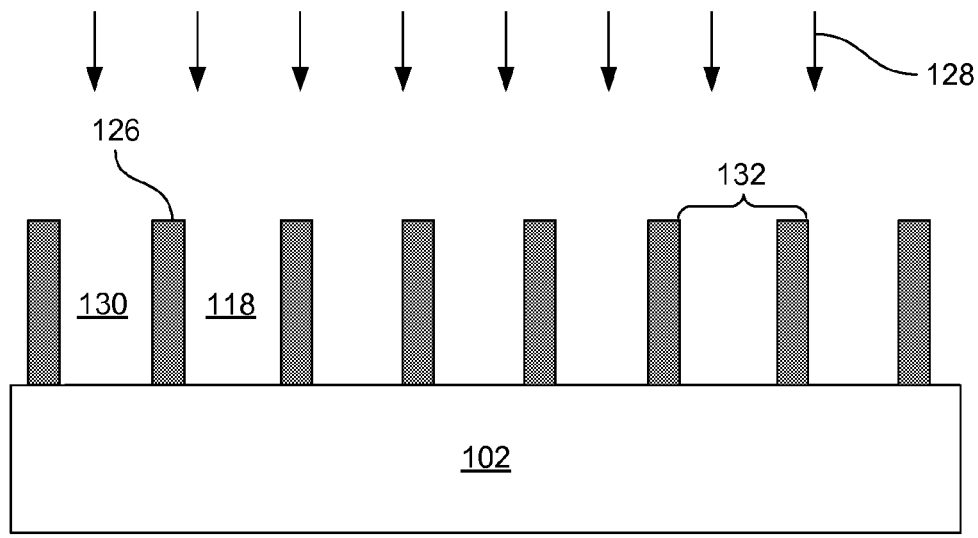

FIG. 1G illustrates a removal process 128 to remove the exposed first spacer layer features 114 while leaving the portions of the second spacer layer 122 substantially intact. The remaining portions of the second spacer layer 122 will then form second spacer layer features 126. The removal process 128 creates a void 130 where the first spacer layer features 114 used to be. The second spacer layer features 126 have a pitch 132 that is based on the pitch 120 and width of the features 114. The width of the second spacer layer features 126 is based in part on the thickness of the first spacer layer features 114.

The removal process 128 is selective such that only the type of material used for the first spacer layer 110 is removed. For example, if the first spacer layer 110 is made of material type A and the second spacer layer 122 is made of material type B, then the anisotropic etching process associated with material type A is used so that the second spacer layer, made of material type B, substantially remains intact.

Figure 1H:
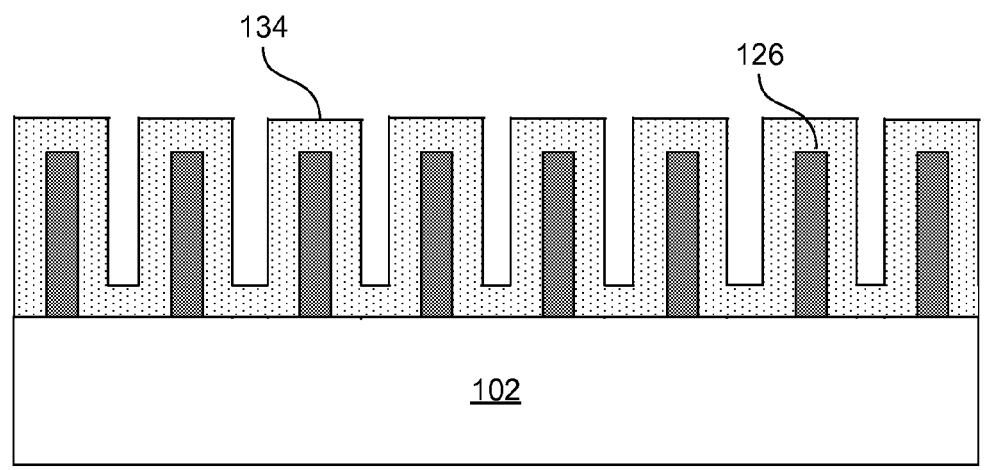

FIG. 1H illustrates deposition of a third spacer layer 134 over the remaining portions of the second spacer layer features 126. The third spacer layer 134 is formed over the features such that it conforms to the features 126. Thus, the profile of the third spacer layer 134 is similar to the profile of the second spacer layer features 126. Additionally, the third spacer layer 134 is formed on both the sidewalls and the tops of the features 126. The third spacer layer 134 may be formed using a CVD process such as a LPCVD process or a PECVD process.

The third spacer layer 134 is made of a material selected form the same type of material as the first spacer layer 110, and thus a different type of material as the second spacer layer 122. For example, if the first spacer layer 110 is selected form a material of material type A, then the third spacer layer 134 is also selected from a material of material type A. Conversely, if the first spacer layer 110 is selected form a material of material type B, then the third spacer layer 134 is also selected from a material of material type B. More specifically, if the first spacer layer 110 is a dielectric material, then the third spacer layer is also a dielectric material. Thus, the third spacer layer 134 also has an etching selectivity with the type of material used for the second spacer layer 122.

Figure 1I:
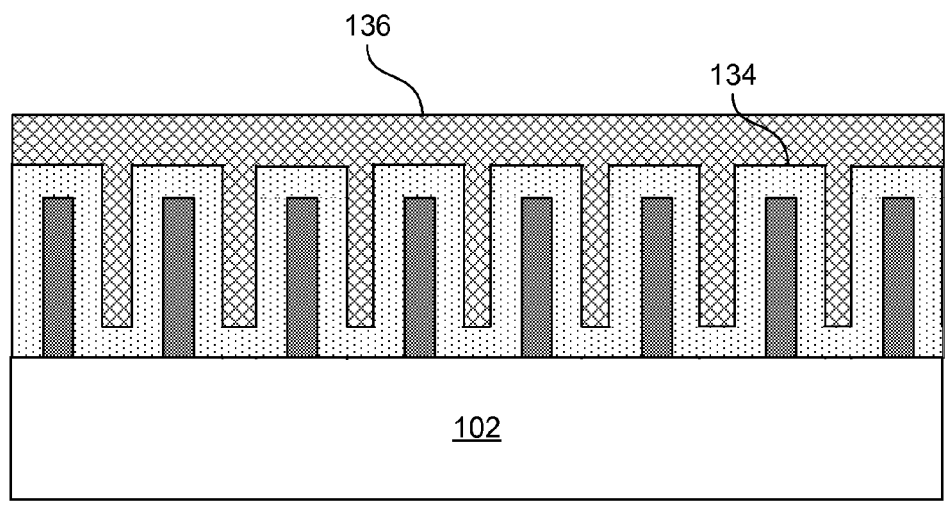

FIG. 1I illustrates one embodiment in which a dielectric layer 136 is formed on the third spacer layer 134. The dielectric layer 136 fills in the spaces between the second spacer layer features 126 that are covered by the third spacer layer 134. The dielectric layer 136 thus acts as a filler layer to fill the gaps between the second spacer layer features 126.

Figure 1J:
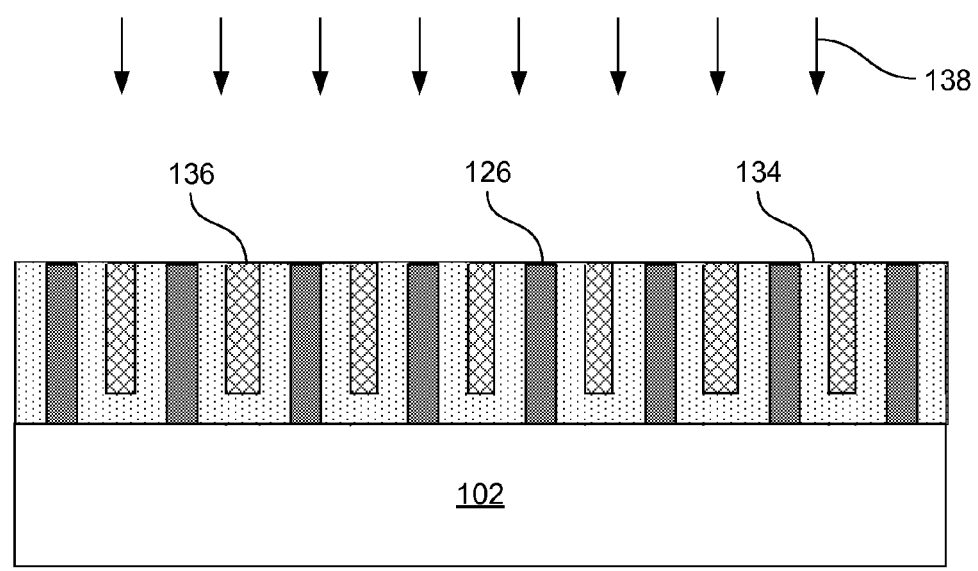

FIG. 1J illustrates a planarizing process 138 that removes the top portion of the dielectric layer 136 and the top portion of the third spacer layer 136 to expose the tops of the features 126. In one example, the planarizing process is a Chemical Mechanical Polishing (CMP) process. A CMP process involves application of a slurry onto the substrate. The slurry includes chemical etchants as well as solid particles. A polishing tool then polishes the surface of the substrate. Thus, the surface is planarized by both the mechanical effect from the solid particles as well as the chemical effect from the chemical etchants.

Figure 1K:
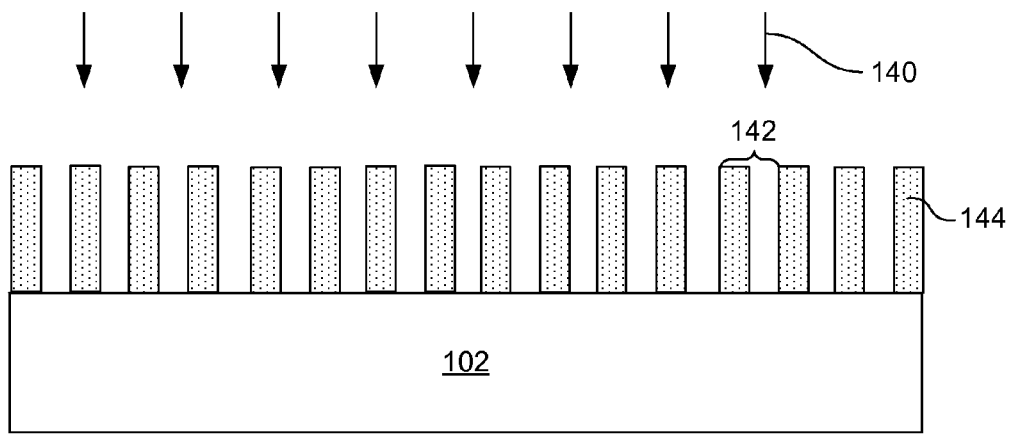

FIG. 1K illustrates a removal process 140 that removes both the dielectric layer 136 and the second spacer layer features 126. In one example, a single etching step that is selective such that both the dielectric layer 136 and the second spacer layer features 126 are removed while leaving the third spacer layer features 144 substantially intact. In one example, the removal process 140 is a two-step process. For example, a first step may remove the dielectric material 136 while leaving the third spacer layer features 144 and the second spacer layer features 126 substantially intact. Then, a second step removes the second spacer layer features 126 while leaving the third spacer layer features 144 substantially intact.

The third spacer layer features 144 have a pitch 142 that is based on the pitch 132 of the second spacer layer features 126 and the width of the second spacer layer features 126. The width of the third spacer layer features 144 is based on the thickness of the third spacer layer. The third spacer layer features 144 can be used as mandrels for further steps similar to the steps described above. Specifically, the process can alternate between the spacer layers of material type A and material type B using the previously deposited spacer layer features as mandrels for the current spacer layer.

In some examples, the mandrel layer 104 may be made of the same type of material as the second spacer layer. For example, if the first spacer layer 110 is made from a material of material type A and the second spacer layer 122 is made from a material of material type B, then the mandrel layer 104 may be made from a material selected from material type B. Conversely, if the first spacer layer 110 is made from a material of material type B and the second spacer layer 122 is made from a material of material type A, then the mandrel layer 104 may be made from a material selected from material type A.

Figure 1L:
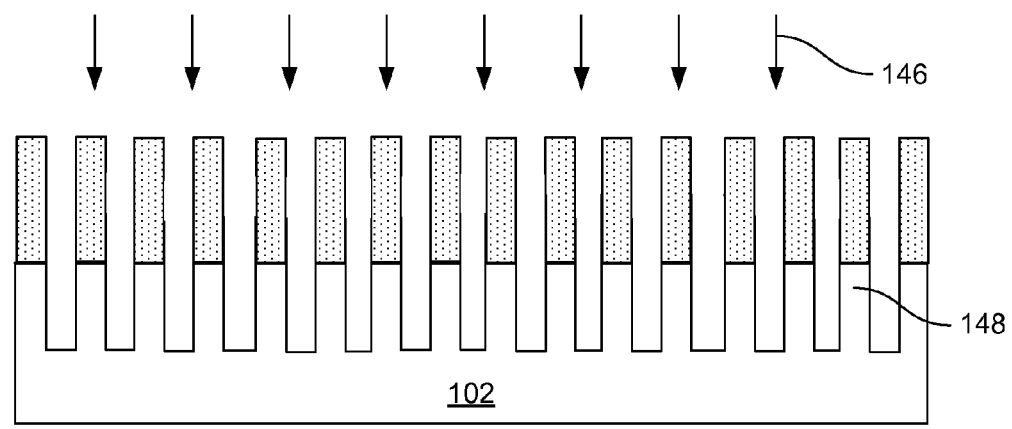

FIG. 1L illustrates an etching process 146 used to transfer the pattern of the third spacer layer features 144 to the underlying substrate 102. If the pattern has reached its intended density or final form, then the pattern can be transferred to the underlying substrate 102. According to the present example, the third spacer layer features 144 act as a hard mask for an etching process 146. Thus, only regions not covered by the third spacer layer features 144 are affected by the etching process 146. This creates features 148 within the substrate 102 that match the patterning of the third spacer layer features 148.

Figure 1M:
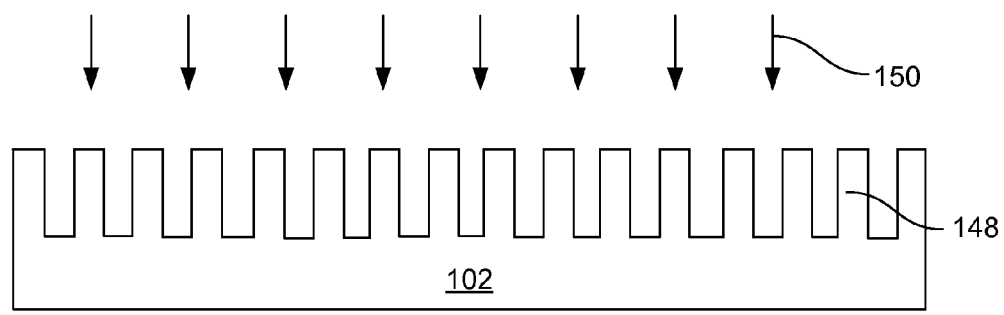

FIG. 1M illustrates a removal process 150 that removes the third spacer layer features 144. The removal process 150 may be an etching process that is selective to the third spacer layer features 144 and thus leave the material of the substrate 102 substantially intact. In one example, the removal process 150 may be a wet etching process or a dry etching process.

Figure 2A:
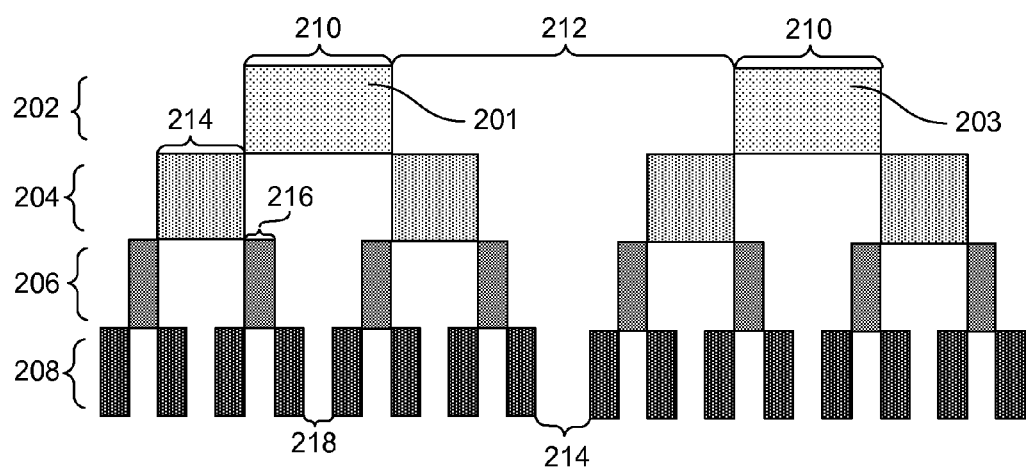
FIGS. 2A-2B is a diagram showing patterns for self-aligned patterning techniques, according to one example of principles described herein.
Figure 2B:
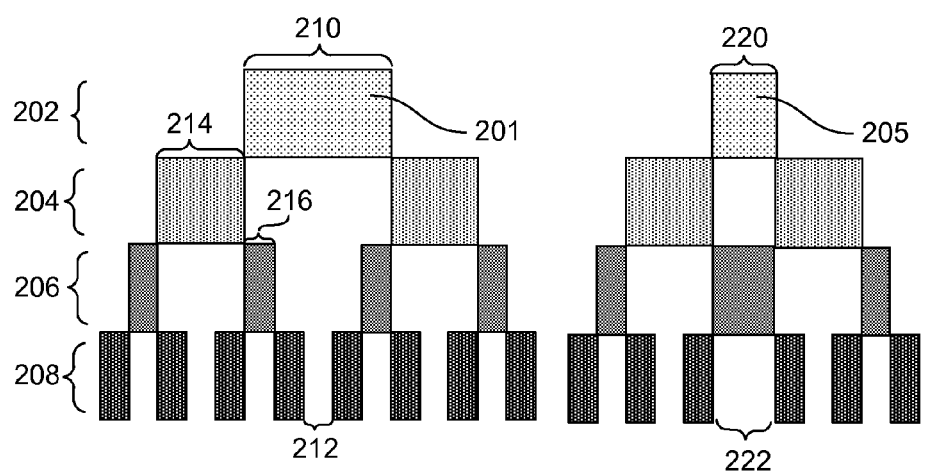

FIGS. 2A-2B is a diagram showing patterns for self-aligned patterning techniques. Specifically, FIGS. 2A and 2B illustrate how patterning of the mandrel layer and spacer layer thickness can be selected so as to achieve a desired final pattern. According to certain illustrative examples, the space between mandrel features in the mandrel layer 202 can be set so as to create specific features in the final pattern. In some cases, the final pattern includes a set of lines, each line having a similar width. In some cases, however, it is desirable that some lines have a larger width than adjacent lines. This can be achieved by tuning the spacing between mandrel features in the mandrel layer 202.

In the present example, the mandrel layer 202 is such that a first feature 201 has a width 210 that is equal to the width 210 of an adjacent second feature 203. The first spacer layer 204 has a thickness 214. The second spacer layer 206 has a thickness 216, which is less than the thickness 214 of the first spacer layer 204. The third spacer layer 208 has the same thickness 216 as the second spacer layer 206.

The first feature 201 and the second feature 203 have a spacing 212 such that a merge feature 214 is eventually formed in the final pattern. In this example, the merge feature has a thickness 214 that is approximately twice the thickness 218 of the other features formed in the final pattern. The spacing 212 can be adjusted as desired to create the desired width for the merge feature 214.

In some examples, other factors can be tuned to create merge features at specific location. For example, merge features can be formed by adjusting the thickness 214 of the first spacer layer 204. Additionally or alternatively, merge features can be created by adjusting the thickness of the second spacer layer 206 or the third spacer layer 208.

FIG. 2B illustrates an embodiment in which one of the mandrel features has a different size in order to create a merge feature 222. Specifically, the mandrel layer 202 has a first feature 201 having a first width 210 and a second feature 205 having a second width 220. The reduced width 220 of the second feature 205 causes two adjacent features of the second spacer layer 206 to merge. This, in turn, causes the merge feature 222 in the final pattern.

Figure 3:
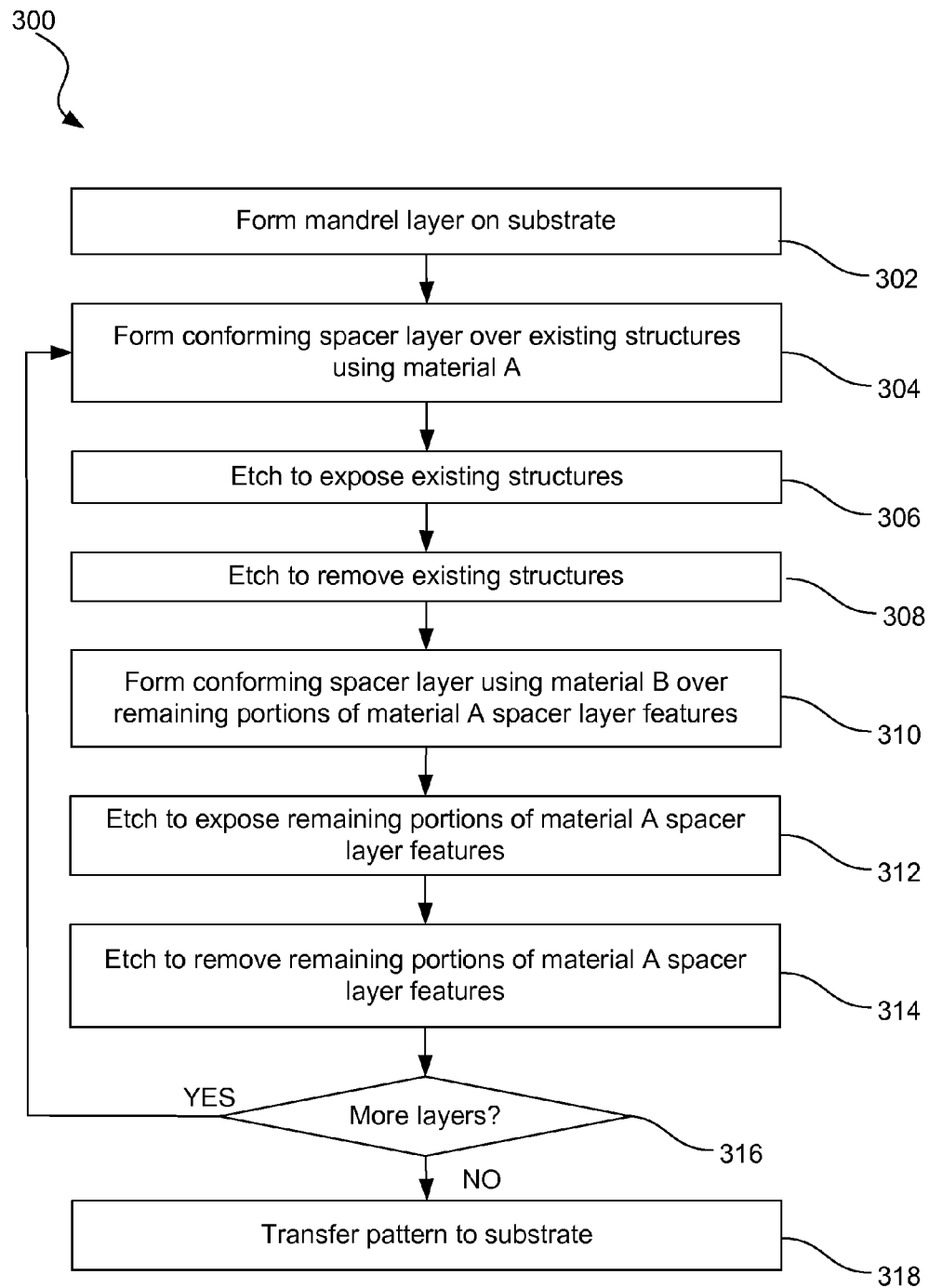
FIG. 3 is a flowchart showing an illustrative method for iterative self-aligned patterning, according to one example of principles described herein.

FIG. 3 is a flowchart showing an illustrative method for iterative self-aligned patterning. According to the present example, the method 300 includes a step 302 for forming a mandrel layer on a substrate. The material for the mandrel layer may be deposited onto the substrate. Then the mandrel layer material may be patterned using a lithographic technique such as photolithography. In some examples, the mandrel layer may be made of the same type of material as the second spacer layer. For example, if the first spacer layer is made from a material of material type A and the second spacer layer is made from a material of material type B, then the mandrel layer is made from a material selected from material type B. In the present example, the mandrel layer is formed using material type B.

The method 300 further includes a step 304 for forming a spacer layer over existing structures using material type A. For the first iteration, the existing structures are the mandrel features. The spacer layer conforms to the existing structures. The spacer layer may be deposited using a CVD process such as LPCVD or PECVD. In one example, step 304 corresponds to the step illustrated in FIG. IB. Specifically, the existing structures correspond to the mandrel features 106 and the spacer layer corresponds to the first spacer layer 110.

The method 300 further includes a step 306 for etching to expose the existing structures. The etching may be an anisotropic etching process such as a dry etching process. The etching process exposes the underlying existing structures, which in the first iteration is the mandrel features. In one example, step 306 corresponds to FIG. 1C. Specifically, the etching process corresponds to the removal process 112.

The method 300 further includes a step 308 for etching to remove the existing structures, which in the first iteration, are the mandrel features. The etching process exposes the underlying substrate. In one example, step 308 corresponds to FIG. 1D. Specifically, the etching process corresponds to the removal process 116.

The method 300 further includes a step 310 for forming an additional spacer layer using material type B. The additional spacer layer conforms to the remaining features of the previously formed spacer layer. In one example, step 310 corresponds to FIG. 1E. Specifically, the additional spacer layer corresponds to the second spacer layer 122.

The method 300 further includes a step 312 for etching to expose the existing structures, which in this case are the remaining features from the previously formed spacer layer. The etching may be an anisotropic etching process such as a dry etching process. In one example, step 312 corresponds to FIG. 1F. Specifically, the etching process corresponds to the removal process 124.

The method 300 further includes a step 314 for etching to remove the features remaining from the previously formed spacer layer. The etching process exposes the underlying substrate. In one example, step 314 corresponds to FIG. 1G. Specifically, the etching process corresponds to the removal process 128.

At step 316, it is determined whether there are any more spacer layers to be formed. Specifically, if the current pattern is the final pattern, then there are no more layers to be formed, and the method proceeds to the next step. But, if the current pattern is not the current pattern, then the method returns to step 304.

The second iteration of step 304 may correspond to FIG. 1H. In this iteration, the spacer layer being formed corresponds to the third spacer layer 134. The existing structures in this case correspond to the second spacer layer features 126. The process then repeats as many times as desired until a final pattern is achieved. In some cases, it may be determined after step 308 whether the current pattern is the final pattern. If so, then the method proceeds to step 318.

The method 300 further includes a step 318 for transferring the pattern to the substrate. This is done if the current pattern is the final pattern. Step 318 may correspond to the steps described in FIGS. 1L-1M. The final pattern that has been transferred to the substrate may be used for a variety of purposes. For example, if the pattern is for the formation of metal lines, then the pattern formed into the substrate can be filled with a metal material. Then, a CMP process can be applied to the wafer to remove excess metal material.

According to the present example, a method for self-aligned patterning includes providing a substrate, forming a patterned mandrel layer that includes a plurality of mandrel features, the patterned mandrel layer being formed on the substrate, depositing a first spacer layer over the mandrel layer, the first spacer layer comprising a first type of material, anisotropically etching the first spacer layer to leave a first set of spacers on sidewalls of the mandrel features, removing the mandrel layer, depositing a second spacer layer over remaining portions of the first set of spacers, and anisotropically etching the second spacer layer to form a second set of spacers on sidewalls of the first set of spacers.

A method for iterative self-aligned patterning includes providing a substrate, forming a patterned mandrel layer on the substrate, depositing a first spacer layer over the mandrel layer such that the first spacer layer conforms to the mandrel layer, the first spacer layer comprising a first type of material, performing a first anisotropic etching process to the first spacer layer using a first etchant, thereby leaving a first set of spacers on sidewalls of the mandrel layer, removing the mandrel layer, forming a second spacer layer over the first set of spacers such that the second spacer layer conforms to the first set of spacers, the second spacer layer comprising a second type of material different from the first type of material, and performing a second anisotropic etching process to the second spacer layer using a second etchant different from the first etchant, thereby forming a second set of spacers on sidewalls of the first set of spacers.

A method for iterative self-aligned patterning, the method including providing a substrate, forming a patterned mandrel layer on the substrate, forming a first set of spacers on sidewalls of the mandrel layer, the first set of spacers comprising a first type of material, removing the mandrel layer, forming a second set of spacers on sidewalls of the first set of spacers, the second set of spacers comprising a second type of material, removing the first set of spacers, forming a third set of spacers on sidewalls of the second set of spacers, the third set of spacers comprising the first type of material, and removing the second set of spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for self-aligned patterning, the method comprising: providing a substrate; forming a patterned mandrel layer that includes a plurality of mandrel features, the patterned mandrel layer being formed on the substrate; depositing a first spacer layer over the mandrel layer, the first spacer layer comprising a first type of material; anisotropically etching the first spacer layer with a first etchant to leave a first set of spacers on sidewalls of the mandrel features;

removing the mandrel layer; depositing a second spacer layer over remaining portions of the first set of spacers; and anisotropically etching the second spacer layer with a second etchant to form a second set of spacers on sidewalls of the first set of spacers, the second etchant being different than the first etchant, removing the first set of spacers of the first spacer layer.

2. The method of claim 1, further comprising:
forming a third spacer layer over remaining portions of the second spacer layer, the third spacer layer comprising a same type of material as the first spacer layer.

3. The method of claim 1, further comprising,
performing an etch process to remove a portion of the substrate exposed through the second spacer layer.

4. The method of claim 1, further comprising:
forming a dielectric layer over the second spacer layer;
performing a Chemical Mechanical Polishing (CMP) process to expose the first spacer layer; and
removing the first spacer layer and the dielectric layer.

5. The method of claim 1, wherein the first type of material comprises a dielectric material.

6. The method of claim 1, wherein the dielectric material comprises at least one of: an oxide, silcon nitride (SiN), silicon oxynitride (SiON), silicon carbide (SiC), silicon carbon nitride (SiCN), or silicon oxycarbon nitride (SiOCN).

7. The method of claim 1, wherein the second type of material comprises a conductive material.

8. The method of claim 1, wherein the second type of material comprises at least one of: amorphous silicon or amorphous carbon.

9. The method of claim 1, wherein a width of the mandrel, a width of the first spacer layer, and a width of the second spacer layer are selected to create a merge feature.

10. A method for iterative self-aligned patterning, the method comprising: providing a substrate; forming a patterned mandrel layer on the substrate; depositing a first spacer layer over the mandrel layer such that the first spacer layer conforms to the mandrel layer, the first spacer layer comprising a first type of material; performing a first anisotropic etching process to the first spacer layer using a first etchant, thereby leaving a first set of spacers on sidewalls of the mandrel layer; removing the mandrel layer; forming a second spacer layer over the first set of spacers such that the second spacer layer conforms to the first set of spacers, the second spacer layer comprising a second type of material different from the first type of material; and performing a second anisotropic etching process to the second spacer layer using a second etchant different from the first etchant, thereby forming a second set of spacers on sidewalls of the first set of spacers, removing the first set of spacers of the first spacer layer.

11. The method of claim 10, further comprising, forming a dielectric layer over the second spacer layer such that the dielectric layer is formed between features of the second spacer layer and covers the features of the second spacer layer.

12. The method of claim 11, further comprising, performing a planarizing process to expose the first spacer layer.

13. The method of claim 12, further comprising, performing a dry etch process to remove the first spacer layer, the dry etch process being selective between the first type of material and the second type of material.

14. The method of claim 13, further comprising, forming a third spacer layer such that the third spacer layer conforms to remaining portions of the second spacer layer, the third spacer layer comprising the first type of material.

15. The method of claim 14, further comprising:
removing a portion of the third spacer layer to expose the second spacer layer; and
performing a dry etch process to remove the second spacer layer, the dry etch process being selective between the first type of material and the second type of material.

16. The method of claim 10, wherein the first etchant selectively removes the first type of material while leaving the second type of material substantially intact and the second etchant selectively removes the second type of material while leaving the first type of material substantially intact.

17. A method for iterative self-aligned patterning, the method comprising:
providing a substrate;
forming a patterned mandrel layer on the substrate;
forming a first set of spacers on sidewalls of the mandrel layer, the first set of spacers comprising a first type of material;
removing the mandrel layer;
forming a second set of spacers on sidewalls of the first set of spacers, the second set of spacers comprising a second type of material;
removing the first set of spacers;
forming a third set of spacers on sidewalls of the second set of spacers, the third set of spacers comprising the first type of material; and
removing the second set of spacers.

18. The method of claim 17, wherein the first type of material is a dielectric material and the first dry etch process utilizes a fluorine based gas.

19. The method of claim 17, wherein the second type of material is a conductive material and the second dry etch process utilizes a chlorine based gas.

* * * * *